(12) United States Patent
Roy (10) Patent No.: US 10,199,409 B2
(45) Date of Patent: *Feb. 5, 2019

(54) TRENCH BETWEEN STACKED SEMICONDUCTOR SUBSTRATES MAKING CONTACT WITH SOURCE-DRAIN REGION

(71) Applicant: STMicroelectronics (Crolles 2) SAS, Crolles (FR)

(72) Inventor: Francois Roy, Seyssins (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

This patent is subject to a terminal disclaimer.

(21) Appl. No.: 15/852,519

(22) Filed: Dec. 22, 2017

(65) Prior Publication Data

US 2018/0122846 A1 May 3, 2018

Related U.S. Application Data

(63) Continuation-in-part of application No. 15/275,619, filed on Sep. 26, 2016, now Pat. No. 9,941,200.

(51) Int. Cl.
*H01L 27/146* (2006.01)
*H01L 21/822* (2006.01)
(Continued)

(52) U.S. Cl.
CPC .. *H01L 27/14609* (2013.01); *H01L 21/76898* (2013.01); *H01L 21/8221* (2013.01);
(Continued)

(58) Field of Classification Search
CPC ............ H01L 29/7869; H01L 2924/00; H01L 27/1207; H01L 27/0688; H01L 27/0922; H01L 27/0924; H01L 27/105; H01L 27/1251; H01L 29/7833; H01L 27/3276; H01L 29/0847; H01L 23/535;
(Continued)

(56) References Cited

U.S. PATENT DOCUMENTS

5,480,837 A 1/1996 Liaw et al.
8,513,761 B2 8/2013 Roy et al.
(Continued)

*Primary Examiner* — Caleen Sullivan
(74) *Attorney, Agent, or Firm* — Crowe & Dunlevy (57) ABSTRACT

A semiconductor device includes a first semiconductor substrate with a first transistor therein. The first transistor includes a first source-drain formed by a doped region in the first semiconductor substrate. An intermediary insulating layer is formed on and above the first semiconductor substrate. A second semiconductor substrate is formed on and above the intermediary insulating layer. A second transistor is formed in the second semiconductor substrate, and includes a second source-drain formed by a doped region in the second semiconductor substrate. A trench is formed in the second semiconductor substrate and in contact with the doped region for the second semiconductor substrate. The trench has a thickness equal to that of the second semiconductor substrate. Metal wiring extends from a contact with the doped region for the first source-drain, through the intermediary insulating layer and the trench, to make electrical contact with the doped region for the second source-drain.

16 Claims, 4 Drawing Sheets

(51) Int. Cl.
   *H01L 21/768* (2006.01)
   *H01L 27/06* (2006.01)
   *H01L 27/11* (2006.01)
   *H01L 21/8234* (2006.01)

(52) U.S. Cl.
   CPC .. *H01L 21/823475* (2013.01); *H01L 27/0688* (2013.01); *H01L 27/1108* (2013.01); *H01L 27/1469* (2013.01); *H01L 27/14603* (2013.01); *H01L 27/14634* (2013.01); *H01L 27/14636* (2013.01); *H01L 27/14643* (2013.01)

(58) Field of Classification Search
   CPC ............ H01L 27/0886; H01L 23/5226; H01L 27/14636; H01L 29/7827; H01L 27/10826; H01L 25/0657
   USPC ........................................................ 257/401
   See application file for complete search history.

(56) References Cited

U.S. PATENT DOCUMENTS

| | | |
|---|---|---|
| 9,941,200 B1 * | 4/2018 | Roy .................... H01L 25/0657 |
| 2006/0234487 A1 | 10/2006 | Kim et al. |
| 2007/0018075 A1 | 1/2007 | Cazaux et al. |
| 2008/0185648 A1 | 8/2008 | Jeong et al. |
| 2012/0199882 A1 | 8/2012 | Shin |
| 2013/0248953 A1 | 9/2013 | Endo et al. |
| 2015/0236058 A1 | 8/2015 | Hu et al. |
| 2015/0311142 A1 | 10/2015 | Sekar et al. |
| 2016/0181155 A1 | 6/2016 | Deprat et al. |

* cited by examiner

TRENCH BETWEEN STACKED SEMICONDUCTOR SUBSTRATES MAKING CONTACT WITH SOURCE-DRAIN REGION

RELATED APPLICATION

This filing is a continuation-in-part of U.S. patent application Ser. No. 15/275,619, entitled CONTACT TRENCH BETWEEN STACKED SEMICONDUCTOR SUBSTRATES, filed Sep. 26, 2016, the disclosure of which is incorporated by reference in its entirety.

TECHNICAL FIELD

The present invention relates to integrated circuit devices formed by two or more stacked semiconductor substrates and, in particular, to a trench contact for electrically interconnecting doped regions within two or more stacked semiconductor substrates.

BACKGROUND

It is known in the art to form integrated circuit devices utilizing two or more stacked semiconductor substrates. In such devices, metal wiring is provided to electrically interconnect circuits supported on and in one of the substrates with circuits supported on and in another of the substrates. These metal wirings occupy space in the layout of the device and this can present a problem with circuits that are arranged in an array format. An array of image pixel circuits is an example of such an integrated circuit device. Space must be provided in the layout to accommodate the metal wirings that pass between the stacked substrate for each circuit element of the array. This has an adverse effect on efforts to minimize pixel pitch distance.

SUMMARY OF THE INVENTION

It is to be understood that both the foregoing general description and the following detailed description are exemplary and explanatory and are intended to provide further explanation of the invention as claimed.

In an embodiment, an integrated circuit device comprises: a first semiconductor substrate layer; a first transistor formed in and above the first semiconductor substrate layer, said first transistor including a first source-drain formed by a doped region in the first semiconductor substrate layer; a second semiconductor substrate layer; a second transistor formed in and above the second semiconductor substrate layer, said second transistor including a second source-drain formed by a doped region in the second semiconductor substrate layer; wherein the second semiconductor substrate layer is placed above the first semiconductor substrate layer and separated therefrom by an intermediary insulating layer; and a first metal wiring extending from an electrical contact with the doped region for the first source-drain, through the intermediary insulating layer and passing through and in electrical contact with the doped region for the second source-drain.

In an embodiment, an integrated circuit device comprises: a first semiconductor substrate layer; a first transistor formed in and above the first semiconductor substrate layer, said first transistor including a first source-drain formed by a doped region in the first semiconductor substrate layer; a second semiconductor substrate layer; a second transistor formed in and above the second semiconductor substrate layer, said second transistor including a second source-drain formed by a doped region in the second semiconductor substrate layer; wherein the second semiconductor substrate layer is placed above the first semiconductor substrate layer and separated therefrom by an intermediary insulating layer; a trench isolation formed in second semiconductor substrate layer and having a thickness equal to a thickness of the second semiconductor substrate layer; and a first metal wiring extending from an electrical contact with the doped region for the first source-drain, through the intermediary insulating layer and passing through the trench isolation to make an electrical contact with the doped region for the second source-drain.

In an embodiment, an integrated circuit device comprises: a first semiconductor substrate layer; a first transistor formed in and above the first semiconductor substrate layer, said first transistor including a first source-drain formed by a doped region in the first semiconductor substrate layer; a second semiconductor substrate layer; a second transistor formed in and above the second semiconductor substrate layer, said second transistor including a second source-drain formed by a doped region in the second semiconductor substrate layer; wherein the second semiconductor substrate layer is placed above the first semiconductor substrate layer and separated therefrom by an intermediary insulating layer; and a first metal wiring extending from an electrical contact with the doped region for the first source-drain, through the intermediary insulating layer and passing through an electrical isolation structure in the second semiconductor substrate layer to make an electrical contact with the doped region for the second source-drain, said electrical isolation structure having a thickness equal to a thickness of the second semiconductor substrate layer.

Also disclosed herein is an integrated circuit device including a first semiconductor substrate layer, with a first transistor formed within the first semiconductor substrate layer. The first transistor includes a first source-drain formed by a doped region in the first semiconductor substrate layer. An intermediary insulating layer is formed on and above the first semiconductor substrate layer. A second semiconductor substrate layer is formed on and above the intermediary insulating layer. A second transistor is formed in the second semiconductor substrate layer, said second transistor including a second source-drain formed by a doped region in the second semiconductor substrate layer. An electrical isolation structure is formed in second semiconductor substrate layer and in contact with the doped region for the second semiconductor substrate layer. The electrical isolation structure has a thickness equal to a thickness of the second semiconductor substrate layer. A first metal wiring extends from an electrical contact with the doped region for the first source-drain, through the intermediary insulating layer and passes through the electrical isolation structure to make an electrical contact with the doped region for the second source-drain.

The electrical isolation structure may be a trench isolation filled with an insulating material, and the first metal wiring may pass through the trench isolation which insulates the first metal wiring from making electrical contact with the second semiconductor substrate layer.

The electrical isolation structure may be wider than the doped region for the second semiconductor substrate layer.

The electrical isolation structure may be wider than the doped region for the first semiconductor substrate layer.

The electrical isolation structure may extend laterally from the doped region for the second semiconductor substrate layer, within the second semiconductor substrate layer, toward a point aligned with a distal end of the doped region for the first semiconductor substrate layer.

The doped region in the second semiconductor substrate layer may have a thickness that is less than a thickness of the second semiconductor substrate layer.

The electrical isolation structure may have a thickness that is greater than that of the doped region in the second semiconductor substrate layer.

The second semiconductor substrate layer may be doped with a p-type dopant and the doped region in the second semiconductor substrate layer may be doped with an n-type dopant.

The second transistor may include a third source-drain formed by an additional doped region in the second semiconductor substrate layer. The second transistor may include a further doped region formed in the additional doped region. A p-n junction may be formed by the additional doped region and the further doped region.

The additional doped region may be, at least in part, thicker than the doped region for the second semiconductor substrate layer.

The further doped region may be thinner than the additional doped region.

Also disclosed herein is a method of fabricating an integrated circuit device. The method includes forming a first semiconductor substrate layer, and forming a first transistor within the first semiconductor substrate layer, the first transistor including a first source-drain formed by a doped region in the first semiconductor substrate layer. The method also includes forming an intermediary insulating layer on and above the first semiconductor substrate layer, forming a second semiconductor substrate layer formed on and above the intermediary insulating layer, and forming a second transistor in the second semiconductor substrate layer, said second transistor including a second source-drain formed by a doped region in the second semiconductor substrate layer. An electrical isolation structure is formed in the second semiconductor substrate layer and in contact with the doped region for the second semiconductor substrate layer by, at least, etching completely through the second semiconductor substrate layer to form a trench and depositing an insulating material in the trench. A first metal wiring is formed to extend from an electrical contact with the doped region for the first source-drain, through the intermediary insulating layer, and through the electrical isolation structure to make an electrical contact with the doped region for the second source-drain.

The first metal wiring may be formed by, at least, etching completely through the electrical isolation structure to form an etched area and depositing a conductive material in the etched area.

Forming the electrical isolation structure may also include performing chemical mechanical polishing on the insulating material after deposition.

Forming the electrical isolation structure may also include annealing the insulating material after chemical mechanical polishing.

Another integrated circuit device is disclosed herein. This integrated circuit device includes a first semiconductor substrate layer, with a first transistor associated with the first semiconductor substrate layer. The first transistor includes a first source-drain region formed by a first doped region in the first semiconductor substrate layer, a second source-drain region spaced apart from the first source-drain region and formed by a second doped region in the first semiconductor substrate layer, a first gate oxide layer extending between the first and second source-drain regions and formed on the first semiconductor substrate layer, and a first gate electrode formed on the first gate oxide layer. An intermediary insulating layer is formed on and above the first semiconductor substrate layer. A second semiconductor substrate layer is formed on and above the intermediary insulating layer. A second transistor is formed in the second semiconductor substrate layer. The second transistor includes a third source-drain region formed by a third doped region in the second semiconductor substrate layer, a fourth source-drain region spaced apart from the third source-drain region and formed by a fourth doped region in the second semiconductor substrate layer, a second gate oxide layer extending between the third and fourth source-drain regions and formed on the second semiconductor substrate layer, and a second gate electrode formed on the second gate oxide layer. A trench is formed in the second semiconductor substrate layer and sized to cover the first gate electrode and the first doped region. A metal wiring extends from an electrical contact with the first source-drain region, through the intermediary insulating layer, and through the trench to electrically connect to the third source-drain region.

The trench may be in contact with the third source-drain region.

The trench may be equal in thickness to the second semiconductor substrate layer.

The fourth doped region may be wider than the first, second, and third doped regions.

A fifth doped region may be formed in the fourth doped region. A p-n junction may be formed by the fourth and fifth doped regions.

BRIEF DESCRIPTION OF THE DRAWINGS

The accompanying drawings are included to provide a further understanding of the invention and are incorporated in and constitute a part of this specification, illustrate embodiments of the invention and together with the description serve to explain the principles of the invention.

In the drawings.

DETAILED DESCRIPTION

Figure 1:
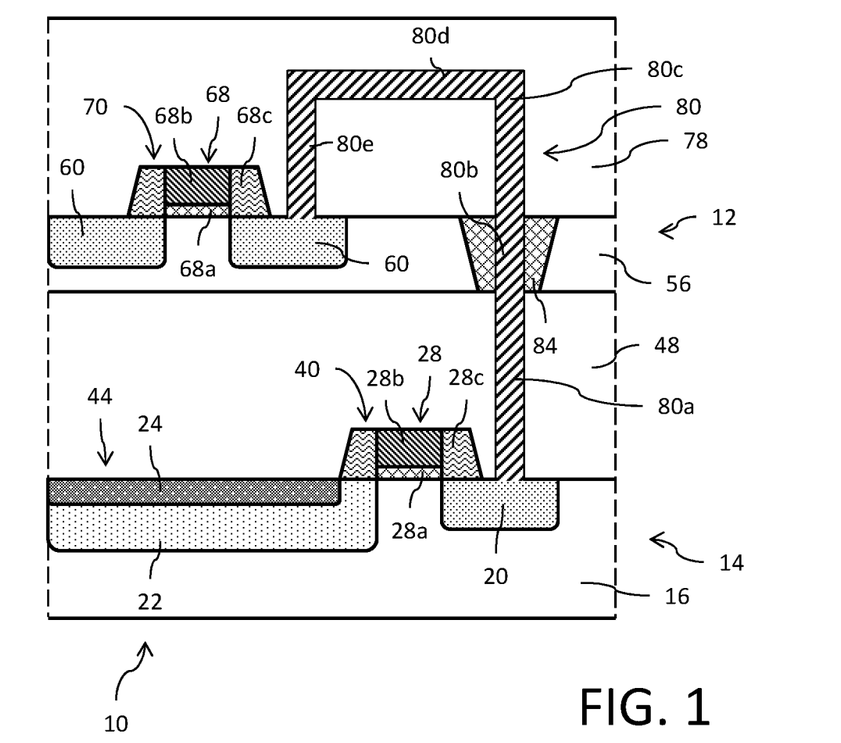
FIG. 1 is a cross-section of an integrated circuit device formed by stacking semiconductor substrates.

Reference is now made to FIG. 1 showing a cross-section of an integrated circuit device 10 formed by stacking an upper semiconductor substrate 12 over a lower semiconductor substrate 14. The device 10 in this example implementation is an image pixel circuit, but it will be understood that this is by way of example only and the technique disclosed herein for supporting the making of electrical contact between stacked semiconductor substrates is useful in many types of integrated circuit devices.

The lower semiconductor substrate 14 includes a semiconductor layer 16 that is, for example, lightly doped with a first conductivity type dopant. In an example, the first conductivity type dopant is a p-type dopant with a dopant concentration of $1 \times 10^{15}$ at/cm$^3$. A plurality of doped regions 20, 22, 24 are provided extending into the semiconductor layer 16 from its top surface. The doped region 20 is heavily doped with a second conductivity type dopant. In an example, the second conductivity type dopant is an n-type dopant with a dopant concentration of $8\times10^{19}$ at/cm$^3$. The doped region 22 is doped with the second conductivity type dopant, for example, with a dopant concentration of $2\times10^{16}$ at/cm$^3$. The doped region 24 is heavily doped with the first conductivity type dopant, for example, with a dopant concentration of $5\times10^{17}$ at/cm$^3$. A transistor gate structure 28 including a gate oxide layer 28a, a gate electrode 28b and sidewall spacers 28c is formed on the top surface of the semiconductor layer 16. For the integrated circuit shown, the doped regions 20 and 22 form source-drain regions for a transistor 40 having the transistor gate structure 28, and the doped regions 22 and 24 form the p-n junction of a photodiode 44. An intermediary insulating layer 48 is provided over the lower semiconductor substrate 14 and the transistor gate structure 28.

The upper semiconductor substrate 12 includes a semiconductor layer 56 that is, for example, lightly doped with the first conductivity type dopant with a dopant concentration of $1\times10^{15}$ at/cm$^3$. A bottom surface of the semiconductor layer 56 is mounted to an upper surface of the intermediary insulating layer 48. A plurality of doped regions 60 are provided extending into the semiconductor layer 56 from its top surface. The doped regions 60 are heavily doped with the second conductivity type dopant with a dopant concentration of $8\times10^{19}$ at/cm$^3$. A transistor gate structure 68 including a gate oxide layer 68a, a gate electrode 68b and sidewall spacers 68c is formed on the top surface of the semiconductor layer 56. For the integrated circuit shown, the doped regions 60 form source-drain regions for a transistor 70 having the transistor gate structure 68. An intermediary insulating layer 78 is provided over the upper semiconductor substrate 12 and the transistor gate structure 68.

A given integrated circuit may require the making of an electrical connection from one doped region in the semiconductor layer 16 of the lower semiconductor substrate 14 to another doped region in the semiconductor layer 56 of the upper semiconductor substrate 12. To provide that electrical connection, metal contacts, lines and vias are provided to define a conductive wiring 80 that includes a portion 80a that extends through the intermediary insulating layer 48, a portion 80b that extends through the semiconductor layer 56, and a portion 80c that extends through the intermediary insulating layer 78. When passing through the semiconductor layer 56, the portion 80b of conductive wiring 80 is insulated from the semiconductor layer 56 itself by a trench isolation structure 84 having a thickness equal to a thickness of the semiconductor layer 56 (for example, of the shallow trench type filled with an insulating oxide material). The portion 80a that extends through the intermediary insulating layer 48 makes electrical contact with a top surface of the doped region 20 for transistor 40. The portion 80c that extends through the intermediary insulating layer 78 makes electrical contact with a top surface of the doped region 60 for transistor 70. The portions 80a-80c collectively form a deep contact. A bridge is formed by portion 80d of the conductive wiring that is realized in a level above the deep contact formed by the portions 80a-80c, and a contact is formed by portion 80e and makes electrical contact with the doped region 60 of the transistor 70.

Figure 2:
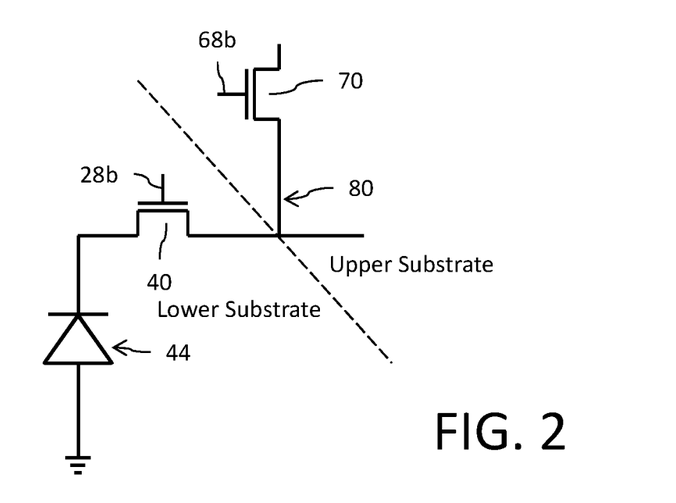
FIG. 2 is a schematic diagram of the integrated circuit device of FIG. 1.

FIG. 2 shows a schematic diagram of the integrated circuit device of FIG. 1. The cross-section of FIG. 1 does not show the full extent of the doped regions 22 and 24 for the photodiode 44. Only the structures for the transfer gate transistor 40 and reset transistor 70 are shown. Those skilled in the art understand that the read circuitry can include additional transistors connected in a known way. Those additional transistors, like with the transistor 70, are supported by the semiconductor layer 56 of the upper semiconductor substrate 12. The pixel of FIG. 1 is of the back-side illuminated type where light is received at the bottom surface of the lower semiconductor substrate 14.

Figure 3:
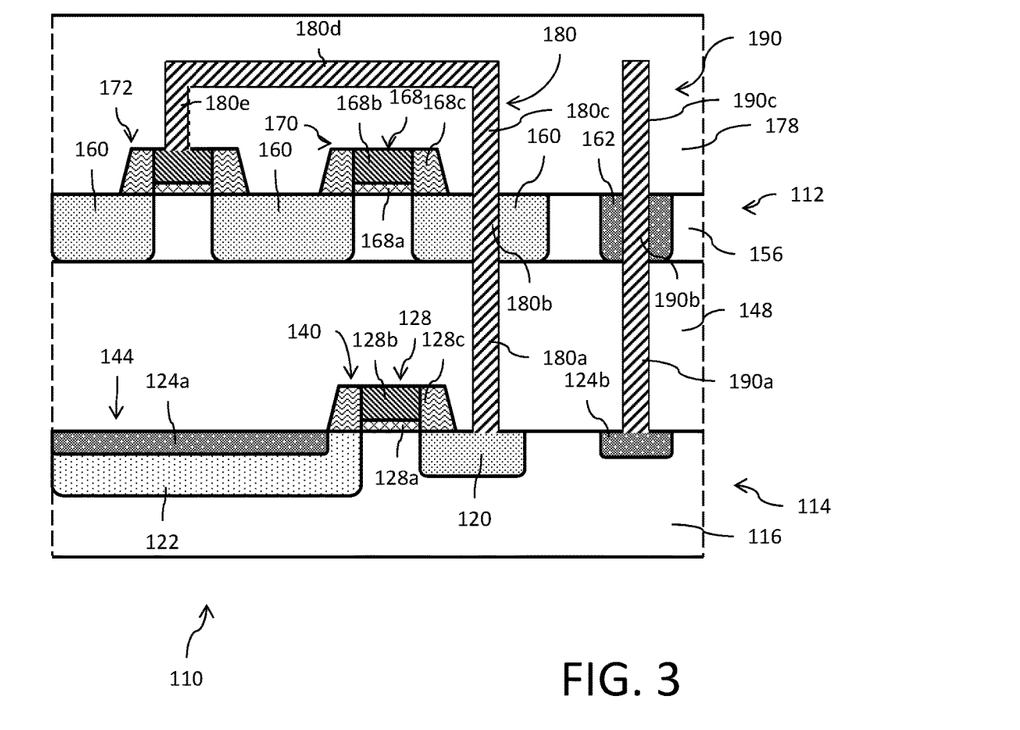
FIG. 3 is a cross-section of an integrated circuit device formed by stacking semiconductor substrates.

Reference is now made to FIG. 3 showing a cross-section of an integrated circuit device 110 formed by stacking an upper semiconductor substrate 112 over a lower semiconductor substrate 114. The device 110 in this example implementation is an image pixel circuit, but it will be understood that this is by way of example only and the technique disclosed herein for supporting the making of electrical contact between stacked semiconductor substrates is useful in many types of integrated circuit devices.

The lower semiconductor substrate 114 includes a semiconductor layer 116 that is, for example, lightly doped with a first conductivity type dopant. In an example, the first conductivity type dopant is a p-type dopant with a dopant concentration of $1\times10^{15}$ at/cm$^3$. A plurality of doped regions 120, 122 and 124a-124b are provided extending into the semiconductor layer 116 from its top surface. The doped region 120 is heavily doped with a second conductivity type dopant. In an example, the second conductivity type dopant is an n-type dopant with a dopant concentration of $8\times10^{19}$ at/cm$^3$. The doped region 122 is doped with the second conductivity type dopant, for example, with a dopant concentration of $2\times10^{16}$ at/cm$^3$. The doped regions 124a and 124b are heavily doped with the first conductivity type dopant, for example, with a dopant concentration of $5\times10^{17}$ at/cm$^3$ and $5\times10^{19}$ at/cm$^3$, respectively. A transistor gate structure 128 including a gate oxide layer 128a, a gate electrode 128b and sidewall spacers 128c is formed on the top surface of the semiconductor layer 116. For the integrated circuit shown, the doped regions 120 and 122 form source-drain regions for a transistor 140 having the transistor gate structure 128, and the doped regions 122 and 124a form the p-n junction of a photodiode 144. The doped region 124b provides a substrate contact region. An intermediary insulating layer 148 is provided over the lower semiconductor substrate 114 and the transistor gate structure 128.

The upper semiconductor substrate 112 includes a semiconductor layer 156 that is, for example, lightly doped with the first conductivity type dopant with a dopant concentration of $8\times10^{19}$ at/cm$^3$. A bottom surface of the semiconductor layer 156 is mounted to an upper surface of the intermediary insulating layer 148. A plurality of doped regions 160 are provided extending into the semiconductor layer 156 from its top surface and having a thickness equal to a thickness of the semiconductor layer 156. The doped regions 160 are heavily doped with the second conductivity type dopant with a dopant concentration of $8\times10^{19}$ at/cm$^3$. One or more doped regions 162 are provided extending into the semiconductor layer 156 from its top surface and having a thickness equal to a thickness of the semiconductor layer 156. The doped regions 162 are heavily doped with the first conductivity type dopant with a dopant concentration of $5\times10^{19}$ at/cm$^3$. A transistor gate structure 168 including a gate oxide layer 168a, a gate electrode 168b and sidewall spacers 168c is formed on the top surface of the semiconductor layer 156 for each of two supported transistors. For the integrated circuit shown, the doped regions 160 form source-drain regions for a first transistor 170 and a second transistor 172, with each transistor having the transistor gate structure 168. The doped region 162 provides a substrate contact region. An intermediary insulating layer 178 is provided over the upper semiconductor substrate 112 and the transistor gate structure 168.

A given integrated circuit may require the making of an electrical connection from one doped region in the semiconductor layer 116 of the lower semiconductor substrate 114 to another doped region in the semiconductor layer 156 of the upper semiconductor substrate 112. The given integrated circuit may further require the making of an electrical connection from one doped region to the gate electrode 168b of a transistor. To provide those electrical connections, metal contacts, lines and vias are provided to define a conductive wiring 180 that includes a portion 180a that extends through the intermediary insulating layer 148, a portion 180b that extends through the semiconductor layer 156, and a portion 180c that extends through the intermediary insulating layer 178. When passing through the semiconductor layer 156, the portion 180b of conductive wiring 180 passes through one of the doped regions 160 and is isolated from the semiconductor layer 156 by that doped region 160. The portion 180a that extends through the intermediary insulating layer 148 makes electrical contact with a top surface of the doped region 120 for transistor 140. The portions 180a-810c collectively form a deep contact. A bridge is formed by portion 180d of the conductive wiring that is realized in a level above the deep contact formed by the portions 180a-180c, and a contact is formed by portion 180e and makes electrical contact with the doped region 160 of the transistor 172.

The given integrated circuit may additionally require the making of an electrical connection from the substrate contact doped region 124b for the semiconductor layer 116 of the lower semiconductor substrate 114 to the substrate contact doped region 162 for the semiconductor layer 156 of the upper semiconductor substrate 112. To provide that electrical connection, metal contacts, lines and vias are provided to define a conductive wiring 190 that includes a portion 190a that extends through the intermediary insulating layer 148, a portion 190b that extends through the semiconductor layer 156, and a portion 190c that extends through the intermediary insulating layer 178. When passing through the semiconductor layer 156, the portion 190b of conductive wiring 190 passes through the doped region 162. The portion 190a that extends through the intermediary insulating layer 198 makes electrical contact with a top surface of the doped region 124b. The portion 180c that extends through the intermediary insulating layer 178 may make electrical contact with a ground pin of the integrated circuit.

Although not shown in FIG. 1, it will be understood that the structures shown in FIG. 3 relating to the making of an electrical connection between substrate contact doped regions in the lower and upper semiconductor substrates are equally applicable to the implementation of FIG. 1. Furthermore, although not shown in FIG. 1, it will be understood that the structures shown in FIG. 3 relating to making contact with the gate electrode of a transistor are equally applicable to the implementation of FIG. 1.

Figure 4:
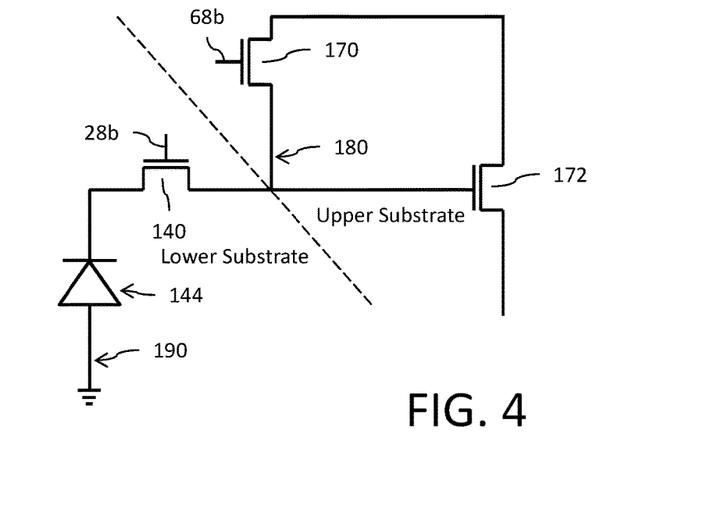
FIG. 4 is a schematic diagram of the integrated circuit device of FIG. 3.

FIG. 4 shows is a schematic diagram of the integrated circuit device of FIG. 3. The cross-section of FIG. 3 does not show the full extent of the doped regions 122 and 124a for the photodiode 144. Only the structures for the transfer gate transistor 140, reset transistor 170 and source-follower transistor 172 are shown. Those skilled in the art understand that the read circuitry can include additional transistors connected in a known way. Those additional transistors, like with the transistors 170 and 172, are supported by the semiconductor layer 156 of the upper semiconductor substrate 112. The pixel of FIG. 3 is of the back-side illuminated type where light is received at the bottom surface of the lower semiconductor substrate 114.

Figure 5:
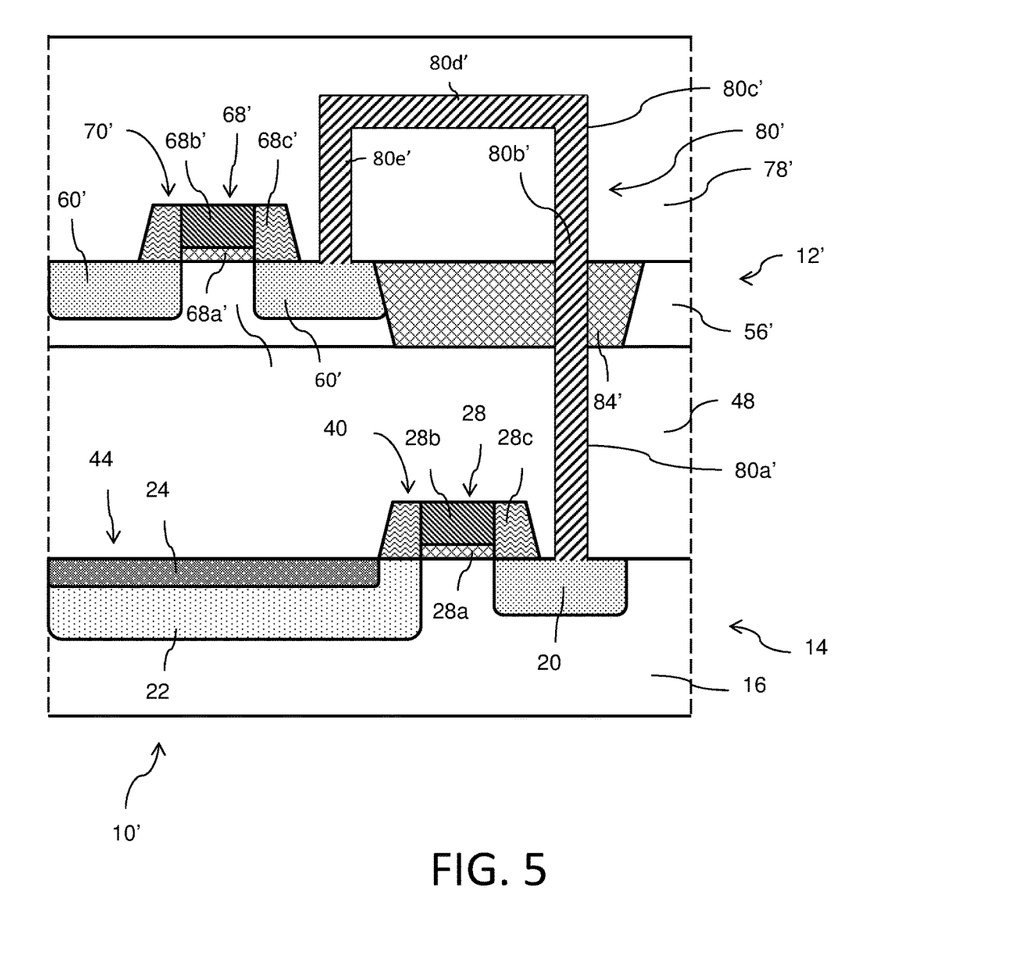
FIG. 5 is a cross-section of an additional embodiment of an integrated circuit device formed by stacking semiconductor substrates.

Reference is now made to FIG. 5 showing a cross-section of an integrated circuit device 10' formed by stacking an upper semiconductor substrate 12' over a lower semiconductor substrate 14. The device 10' in this example implementation is an image pixel circuit, but it will be understood that this is by way of example only and the technique disclosed herein for supporting the making of electrical contact between stacked semiconductor substrates is useful in many types of integrated circuit devices.

The lower semiconductor substrate 14 includes a semiconductor layer 16 that is, for example, lightly doped with a first conductivity type dopant. In an example, the first conductivity type dopant is a p-type dopant with a dopant concentration of $1 \times 10^{15}$ at/cm$^3$. A plurality of doped regions 20, 22, 24 are provided extending into the semiconductor layer 16 from its top surface. The doped region 20 is heavily doped with a second conductivity type dopant. In an example, the second conductivity type dopant is an n-type dopant with a dopant concentration of $8 \times 10^{19}$ at/cm$^3$. The doped region 22 is doped with the second conductivity type dopant, for example, with a dopant concentration of $2 \times 10^{16}$ at/cm$^3$. The doped region 24 is heavily doped with the first conductivity type dopant, for example, with a dopant concentration of $5 \times 10^{17}$ at/cm$^3$. A transistor gate structure 28 including a gate oxide layer 28a, a gate electrode 28b and sidewall spacers 28c is formed on the top surface of the semiconductor layer 16. For the integrated circuit shown, the doped regions 20 and 22 form source-drain regions for a transistor 40 having the transistor gate structure 28, and the doped regions 22 and 24 form the p-n junction of a photodiode 44. An intermediary insulating layer 48 is provided over the lower semiconductor substrate 14 and the transistor gate structure 28.

The upper semiconductor substrate 12' includes a semiconductor layer 56' that is, for example, lightly doped with the first conductivity type dopant with a dopant concentration of $1 \times 10^{15}$ at/cm$^3$. A bottom surface of the semiconductor layer 56' is mounted to an upper surface of the intermediary insulating layer 48'. A plurality of doped regions 60' are provided extending into the semiconductor layer 56' from its top surface. The doped regions 60' are heavily doped with the second conductivity type dopant with a dopant concentration of $8 \times 10^{19}$ at/cm$^3$. A transistor gate structure 68' including a gate oxide layer 68a', a gate electrode 68b' and sidewall spacers 68c' is formed on the top surface of the semiconductor layer 56'. For the integrated circuit shown, the doped regions 60' form source-drain regions for a transistor 70' having the transistor gate structure 68'. An intermediary insulating layer 78' is provided over the upper semiconductor substrate 12' and the transistor gate structure 68'.

A given integrated circuit may require the making of an electrical connection from one doped region in the semiconductor layer 16 of the lower semiconductor substrate 14 to another doped region in the semiconductor layer 56' of the upper semiconductor substrate 12'. To provide that electrical connection, metal contacts, lines and vias are provided to define a conductive wiring 80' that includes a portion 80a' that extends through the intermediary insulating layer 48, a portion 80b' that extends through the semiconductor layer 56', and a portion 80c' that extends through the intermediary insulating layer 78'. When passing through the semiconductor layer 56', the portion 80b' of conductive wiring 80' is insulated from the semiconductor layer 56' itself by a trench isolation structure 84' having a thickness equal to a thickness of the semiconductor layer 56' (for example, of the shallow trench type filled with an insulating oxide material).

The trench isolation structure 84' is in physical contact with the doped region 60', and is wider than either doped region 60', as well as wider than the doped region 20. The doped region 22, however, is wider than the trench isolation structure 84'. The trench isolation structure 84' extends laterally from the doped region 60', within the semiconductor substrate layer 56', toward a point aligned with a distal end of the doped region 20.

The portion 80a' that extends through the intermediary insulating layer 48 makes electrical contact with a top surface of the doped region 20 for transistor 40. The portions 80a'-80c' collectively form a deep contact. A bridge is formed by portion 80d' of the conductive wiring that is realized in a level above the deep contact formed by the portions 80a'-80c', and a contact is formed by portion 80e' and makes electrical contact with the doped region 60' of the transistor 70'.

Formation of the transistor 70' is now described. After bonding of the upper semiconductor substrate 12' to the intermediary insulating layer 48, the upper semiconductor substrate 12' is thinned, for example to 300 nm, and is then patterned for the trench of the isolation structure 84'. It is noted that during this patterning, the trench for the trench isolation structure 84' is fully etched. Thereafter, $SiO_2$ is deposited into the trench to form the trench isolation structure 84' and provide it with electrical isolation properties. Then, chemical mechanical polishing is performed on the upper semiconductor substrate 12', and the upper semiconductor substrate 12' is subjected to a high temperature annealing process to densify the deposited $SiO_2$ fill material.

Then, the gate oxide 68a' is deposited, and the gate electrode 68b' is fabricated. Thereafter, the upper semiconductor substrate 12' is patterned for the source-drain regions 20', and the source-drain regions 20' are implanted. Thereafter, the gate sidewall spacers 68c' are deposited, and the source-drain regions 20' are silicided. The intermediary insulating layer 78' is then deposited, and chemical mechanical polishing is performed again. Next, the intermediary layer 78' is patterned for the conductive wiring 80'. The etching performed for the patterning cuts all the way down through the trench isolation structure 84', through the intermediary layer 78' to the doped region 20. The conductive wiring 80' is then formed, and the intermediary insulating 78' layer is built up again via deposition.

Figure 6:
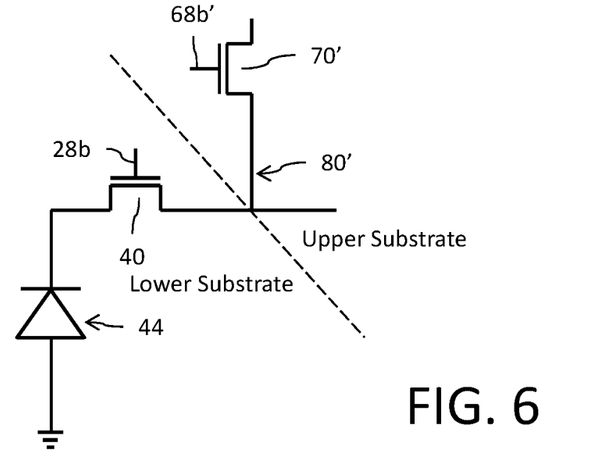
FIG. 6 is a schematic diagram of the integrated circuit device of FIG. 5.

FIG. 6 shows a schematic diagram of the integrated circuit device of FIG. 5. The cross-section of FIG. 5 does not show the full extent of the doped regions 22 and 24 for the photodiode 44. Only the structures for the transfer gate transistor 40 and reset transistor 70' are shown. Those skilled in the art understand that the read circuitry can include additional transistors connected in a known way. Those additional transistors, like with the transistor 70, are supported by the semiconductor layer 56' of the upper semiconductor substrate 12'. The pixel of FIG. 5 is of the back-side illuminated type where light is received at the bottom surface of the lower semiconductor substrate 14.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

The invention claimed is:

1. An integrated circuit device, comprising:
   a first semiconductor substrate layer;
   a first transistor formed within the first semiconductor substrate layer, the first transistor including a first source-drain formed by a doped region in the first semiconductor substrate layer;
   an intermediary insulating layer formed on and above the first semiconductor substrate layer;
   a second semiconductor substrate layer formed on and above the intermediary insulating layer;
   a second transistor formed in the second semiconductor substrate layer, said second transistor including a second source-drain formed by a doped region in the second semiconductor substrate layer;
   an electrical isolation structure formed in second semiconductor substrate layer and in contact with the doped region for the second semiconductor substrate layer, the electrical isolation structure having a thickness equal to a thickness of the second semiconductor substrate layer; and
   a first metal wiring extending from an electrical contact with the doped region for the first source-drain, through the intermediary insulating layer and the electrical isolation structure to make an electrical contact with the doped region for the second source-drain.

2. The integrated circuit device of claim 1, wherein the electrical isolation structure is a trench isolation filled with an insulating material, the first metal wiring passing through the trench isolation which insulates the first metal wiring from making electrical contact with the second semiconductor substrate layer.

3. The integrated circuit device of claim 1, wherein the electrical isolation structure is wider than the doped region for the second semiconductor substrate layer.

4. The integrated circuit device of claim 1, wherein the electrical isolation structure is wider than the first metal wiring.

5. The integrated circuit device of claim 1, wherein the electrical isolation structure extends laterally from the doped region for the second semiconductor substrate layer, within the second semiconductor substrate layer, toward a point aligned with a distal end of the doped region for the first semiconductor substrate layer.

6. The integrated circuit device of claim 1, wherein said doped region in the second semiconductor substrate layer has a thickness that is less than a thickness of the second semiconductor substrate layer.

7. The integrated circuit device of claim 6, wherein the electrical isolation structure has a thickness that is greater than a thickness of the doped region in the second semiconductor substrate layer.

8. The integrated circuit device of claim 6, wherein the second semiconductor substrate layer is doped with a p-type dopant and the doped region in the second semiconductor substrate layer is doped with an n-type dopant.

9. The integrated circuit device of claim 1, wherein the second transistor includes a third source-drain formed by an additional doped region in the second semiconductor substrate layer; wherein the second transistor includes a further doped region formed in the additional doped region; and wherein a p-n junction is formed by the additional doped region and the further doped region.

10. The integrated circuit device of claim 9, wherein the additional doped region is, at least in part, thicker than the doped region for the second semiconductor substrate layer.

11. The integrated circuit device of claim 9, wherein the further doped region is thinner than the additional doped region.

12. An integrated circuit device, comprising:
a first semiconductor substrate layer;
a first transistor associated with the first semiconductor substrate layer and comprising:
  a first source-drain region formed by a first doped region in the first semiconductor substrate layer;
  a second source-drain region spaced apart from the first source-drain region and formed by a second doped region in the first semiconductor substrate layer;
  a first gate oxide layer extending between the first and second source-drain regions and formed on the first semiconductor substrate layer; and
  a first gate electrode formed on the first gate oxide layer;
an intermediary insulating layer formed on and above the first semiconductor substrate layer;
a second semiconductor substrate layer formed on and above the intermediary insulating layer;
a second transistor formed in the second semiconductor substrate layer and comprising:
  a third source-drain region formed by a third doped region in the second semiconductor substrate layer;
  a fourth source-drain region spaced apart from the third source-drain region and formed by a fourth doped region in the second semiconductor substrate layer;
  a second gate oxide layer extending between the third and fourth source-drain regions and formed on the second semiconductor substrate layer; and
  a second gate electrode formed on the second gate oxide layer;
a trench isolation structure formed in the second semiconductor substrate layer and sized to cover the first gate electrode and the first doped region; and
a metal wiring extending from an electrical contact with the first source-drain region, through the intermediary insulating layer, and through the trench to electrically connect to the third source-drain region.

13. The integrated circuit device of claim 12, wherein the trench is in contact with the third source-drain region.

14. The integrated circuit device of claim 12, wherein the trench has a thickness equal to a thickness of the second semiconductor substrate layer.

15. The integrated circuit device of claim 12, wherein the fourth doped region is wider than each of the first, second, and third doped regions individually.

16. The integrated circuit device of claim 15, further comprising a fifth doped region formed in the fourth doped region; and wherein a p-n junction is formed by the fourth and fifth doped regions.

* * * * *